(12) United States Patent
Pierrat

(10) Patent No.: US 6,797,441 B2
(45) Date of Patent: Sep. 28, 2004

(54) METHOD AND APPARATUS FOR USING A COMPLEMENTARY MASK TO CLEAR PHASE CONFLICTS ON A PHASE SHIFTING MASK

(75) Inventor: Christophe Pierrat, Santa Clara, CA (US)

(73) Assignee: Numerical Technologies, Inc., San Jose, CA (US)

( * ) Notice: Subject to any disclaimer, the term of this patent is extended or adjusted under 35 U.S.C. 154(b) by 140 days.

(21) Appl. No.: 10/294,253

(22) Filed: Nov. 14, 2002

(65) Prior Publication Data

US 2004/0076892 A1 Apr. 22, 2004

Related U.S. Application Data

(63) Continuation-in-part of application No. 10/277,250, filed on Oct. 21, 2002.

(51) Int. Cl.⁷ .............................................. G03F 9/00
(52) U.S. Cl. ........................................................ 430/5
(58) Field of Search ....................... 430/5, 394; 716/19, 716/21

(56) References Cited

U.S. PATENT DOCUMENTS 6,730,463 B2 * 5/2004 Heissmeier et al. ........ 430/394

* cited by examiner

*Primary Examiner*—S. Rosasco
(74) *Attorney, Agent, or Firm*—Park, Vaughan & Fleming LLP

(57) ABSTRACT

When substantially all of a layout for a layer of material in an integrated circuit (IC) is being defined using a phase shifting mask, the complementary mask used to define the remaining features and edges can be improved if some of the cuts on the complementary mask are substantially 180-degrees out of phase with one another. This helps cuts that are close to one another to print better and prevents undesirable deterioration of the features printed using the phase mask. Additionally, (semi-)isolated cuts can be reinforced with assist bars to ensure that the cut clears the unexposed regions left by phase conflicts.

26 Claims, 6 Drawing Sheets

TRIM AERIAL IMAGE 200

202    204

AERIAL IMAGE 206

208

TRIM AERIAL IMAGE 400

402   404

AERIAL IMAGE 406

408

METHOD AND APPARATUS FOR USING A COMPLEMENTARY MASK TO CLEAR PHASE CONFLICTS ON A PHASE SHIFTING MASK

RELATED APPLICATION

This application is a continuation-in-part of a pending U.S. patent application, entitled "Performing Optical Proximity Correction on Trim-level Segments not Abutting Features to be Printed," by inventor Christophe Pierrat, Ser. No. 10/277,250, filed Oct. 21, 2002. This application hereby claims priority under 35 U.S.C. §120 to the above-listed patent application.

BACKGROUND

1. Field of the Invention

The invention relates to the process of fabricating semiconductor chips. More specifically, the invention relates to a method and an apparatus for assigning different phases to selected cuts on a complementary mask to clear phase conflicts generated by a phase shifting mask during an optical lithography process used in fabricating a semiconductor chip.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process begins with the formation of a photoresist layer on the surface of a semiconductor wafer. A mask composed of opaque regions, which are generally formed of chrome, and light-transmissive clear regions, which are generally formed of quartz, is then positioned over this photoresist layer. (Note that the term "mask" as used in this specification is meant to include the term "reticle.") Light is then shone on the mask from a visible light source, an ultraviolet light source, or more generally some type of electromagnetic radiation source together with suitably adapted masks and lithography equipment.

This image is reduced and focused through an optical system containing a number of lenses, filters, and mirrors. The light passes through the clear regions of the mask and exposes the underlying photoresist layer. At the same time, opaque regions of the mask block the light leaving underlying portions of the photoresist layer unexposed.

The exposed photoresist layer is then developed, through chemical removal of either the exposed or non-exposed regions of the photoresist layer. The end result is a semiconductor wafer with a photoresist layer having a desired pattern. This pattern can then be used for etching underlying regions of the wafer.

Printing Problems with Cuts in Close Proximity

As integration densities continue to increase, it is becoming desirable to use phase shifters to define more and more features within a layout. This can lead to problems in some situations. For example, FIG. 1A illustrates the phase shifters for a dark field alternating aperture phase shifting mask 100. The phase shifters (shown interposed against the original layout shown with a lighter stipple than the rest of the field and with slanted lines to indicate phase shifters) are set on a dark field, e.g. chromium. The lightly stippled areas between the phase shifters correspond to the intended, or original layout.

Referring to FIG. 1A, a desired feature 102 can be formed using zero-degree phase shifter 104 and 180-degree phase shifter 106. At the right end of feature 102, there is a small region 108, or cut, between phase shifters 104 and 106 that is not part of the layout and is not intended to print. Region 108 will leave a dark area that must be cleared by a complementary, or trim, mask during the optical lithography process, additionally there may be a loss of definition in the areas surrounding this region.

A complementary mask 101 (also known as a trim mask) provides a corresponding cut 110 at the appropriate location to fully expose the photoresist in region 108. Note that other cuts in complementary mask 101 expose other regions that are not intended to print between phase shifters on phase shifting mask 100.

In particular, note that cuts 112 and 114 are in close proximity to each other on the complementary mask 101. This can cause unwanted exposure in a region between cuts 112 and 114. This can be seen by examining FIG. 2A, which illustrates an aerial image 200 created by exposure through complementary mask 101. An areas' intensity of exposure is shown using colors with the most intensity shown as red, orange, yellow, green, blue, and violet in descending intensity. Consider areas 202 and 204, which correspond to cuts 112 and 114, respectively, in complementary mask 101. Note that the close proximity of cuts 112 and 114 to each other causes unwanted exposure of the region between cuts 112 and 114.

This unwanted exposure results in a lack of definition in the printed image between cuts 112 and 114. This lack of definition is apparent in corresponding region 208 in FIG. 2B, which presents an aerial image 206 of how the layout will print. Notably, the lighter blue color in region 208 of the feature shows that the line may be broken. In FIGS. 2A and 2B, the exposure conditions used were $\lambda$=193 nm, NA=0.85, $\sigma$=0.4, dosage ratio 3:1 (trim:phase ratio in mJ/cm$^2$).

Hence, what is needed is a method and an apparatus for clearing phase conflicts on a phase shifting mask without the problems described above.

SUMMARY

One embodiment of the invention provides a system that assigns different phases to selected cuts on a complementary mask used to clear phase conflicts generated by a phase shifting mask during an optical lithography process used in fabricating a semiconductor chip. The system first receives the complementary mask, which uses cuts to clear phase conflicts generated by the phase shifting mask. Next, the system identifies the cuts on the complementary mask that may not clear the phase conflicts, and then assigns a different phase to selected cuts on the complementary mask, so that the selected cuts are out-of-phase with other cuts on the complementary mask. Assigning a different phase to the selected cuts ensures that the cuts on the complementary mask clear the phase conflicts generated by the phase shifting mask. And assists in the definition of the adjacent features.

In a variation of this embodiment, identifying the cuts that may not clear the phase conflicts involves locating cuts that are close enough to each other to cause unwanted exposure in the region between the cuts during the exposure through the complementary mask. In some instances the unwanted exposure may be an over exposure (e.g. feature definition suffers), in other instances the unwanted exposure may be an under exposure (e.g. conflict not fully cleared.)

In a further variation, the system varies the phase between the cuts to eliminate the unwanted exposure in the region between the cuts during the exposure through the complementary mask.

In a further variation, identifying the cuts that may not clear the phase conflicts involves locating isolated cuts that are too small to clear the phase conflicts.

In a further variation, assigning the different phase to selected cuts on the complementary mask involves adding out-of-phase assist features to the complementary mask in proximity to the isolated cuts.

In a further variation, identifying the cuts on the complementary mask that may not clear the phase conflicts involves simulating exposures through the phase shifting mask and the trim mask to produce a simulation result, and then examining the simulation results.

BRIEF DESCRIPTION OF THE FIGURES

The patent or application file contains at least one drawing executed in color. Copies of this patent or patent application publication with color drawing(s) will be provided by the Patent and Trademark Office upon request and payment of the necessary fee.

DETAILED DESCRIPTION

Phase Shifters on a Complementary Mask

Figure 3:
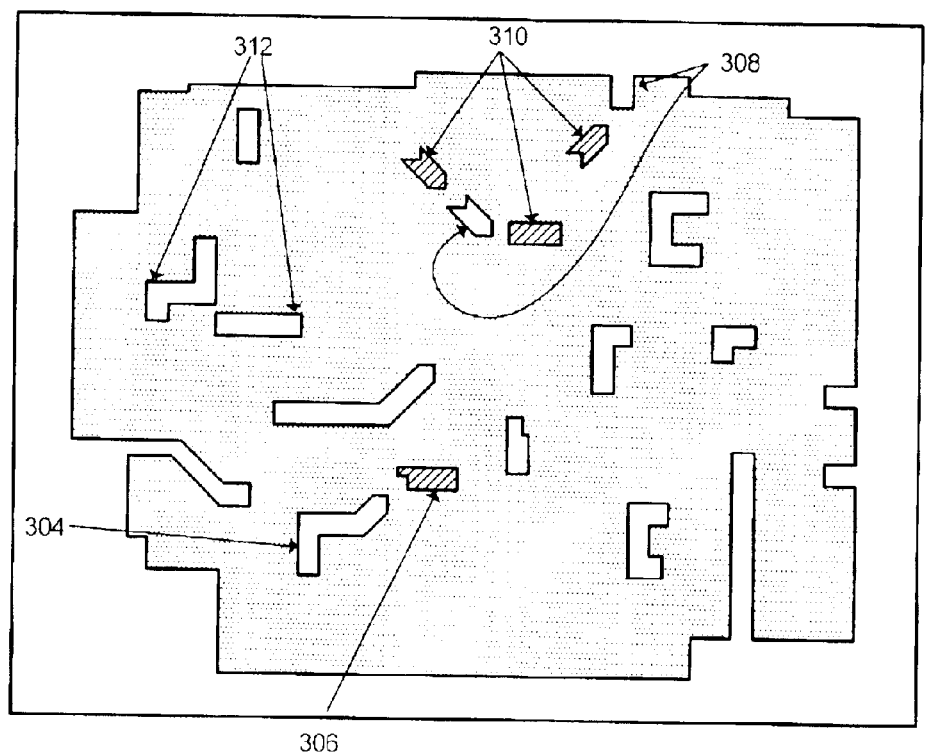
FIG. 3 illustrates phase assignments on complementary mask 302 in accordance with an embodiment of the invention.

FIG. 3 illustrates phase assignments on complementary mask 302 in accordance with an embodiment of the invention. The complementary mask 302 is designed to be used in conjunction with the phase shift mask 100. As is illustrated in FIG. 3, complementary mask 302 includes cut 306, which is in close proximity to cut 304. Complementary mask 302 also includes cuts 310 which are in close proximity to cuts 308. In order to alleviate the problems caused by the close proximity between cuts, the system assigns a phase substantially 180-degrees out of phase with the reference phase to cuts 306 and 310 and a phase substantially equal to the reference phase to other cuts in complementary mask 302. For convenience of discussion, the reference phase may be referred to as zero-degree and the other shifters referred to as 180-degrees shifters. This phase assignment avoids unwanted exposure in the region between cut 304 and cut 306, as well as in the regions between cuts 310 and cuts 308. This reduction in unwanted exposure allows cuts 304, 306, 308, and 310 to effectively clear phase conflicts generated by a phase shifting mask. In contrast, the cuts 312 have the same phase because there is no feature between the cuts and the exposure is adequate to clear the phase conflicts.

Trim Aerial Image

Figure 2A:
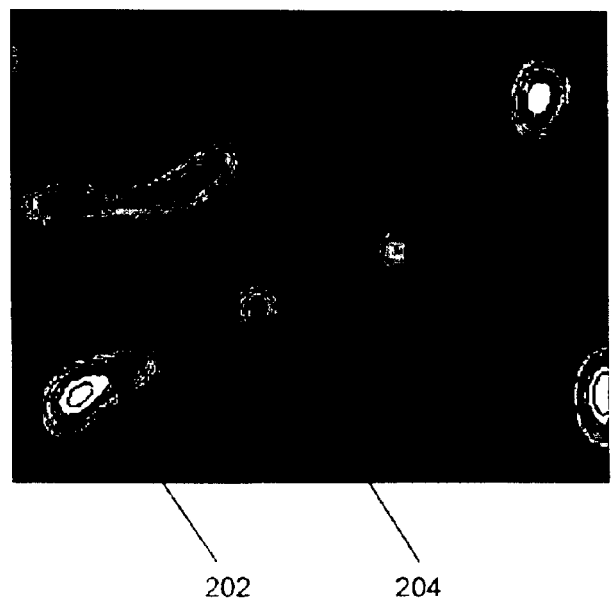
FIG. 2A presents an aerial image 200 illustrating the effects of cuts on complementary mask 101.
Figure 4A:
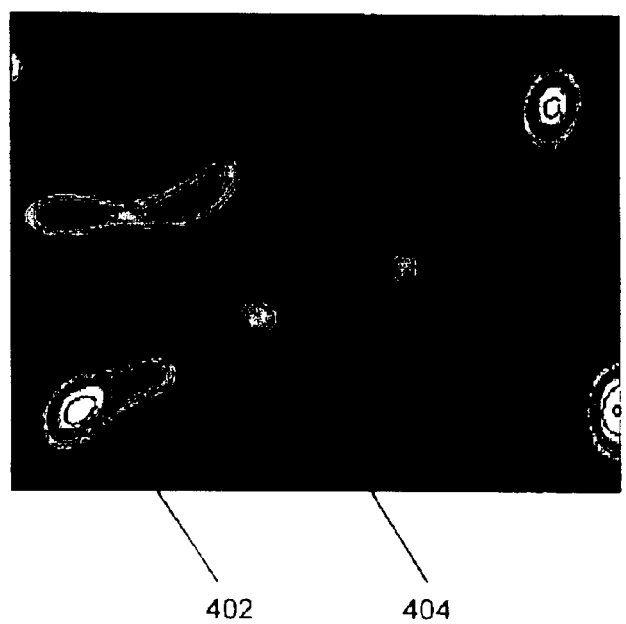
FIG. 4A presents an aerial image 400 illustrating how phase assignments on complementary mask 302 affect exposure through complementary mask 302 in accordance with an embodiment of the invention.

FIG. 4A presents an aerial image 400 of the complementary mask 302 illustrating how phase assignments on complementary mask 302 affect the exposure through complementary mask 302 in accordance with an embodiment of the invention. Consider regions 402 and 404, which correspond to cuts 304 and 306, respectively, on complementary mask 302. Note that assigning a different phase to cut 306 significantly improves the exposure between regions 402 and 404 when compared with the corresponding exposure between regions 202 and 204 in FIG. 2A.

Aerial Image

Figure 2B:
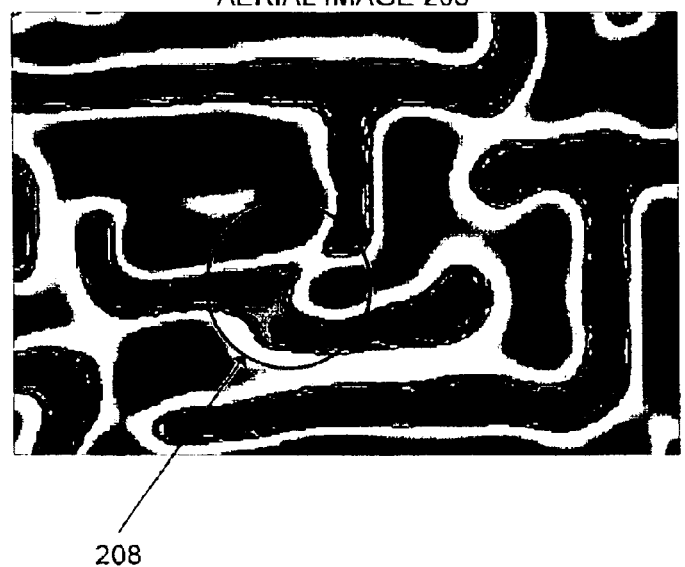
FIG. 2B presents an aerial image 206 illustrating the effects of cuts on complementary mask 101.
Figure 4B:
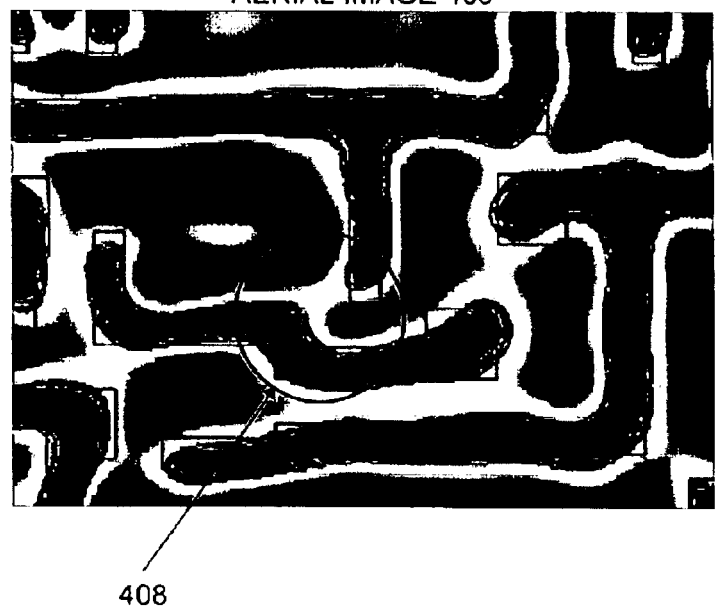
FIG. 4B presents an aerial image 406 illustrating how phase assignments on complementary mask 302 affect a printed layout in accordance with an embodiment of the invention.

FIG. 4B presents an aerial image 406 illustrating how phase assignments on complementary mask 302 affect a printed layout in accordance with an embodiment of the invention when used in conjunction with the phase shift mask 100. The exposure conditions are $\lambda=193$ nm, NA=0.85, $\sigma=0.4$, dosage ration 3:1 (trim:phase in mJ/cm$^2$) Note the improved definition of region 408, which corresponds with the region between cuts 304 and 306 in FIG. 3, when compared against corresponding region 208 in FIG. 2B.

Assist Features

Figure 1B:
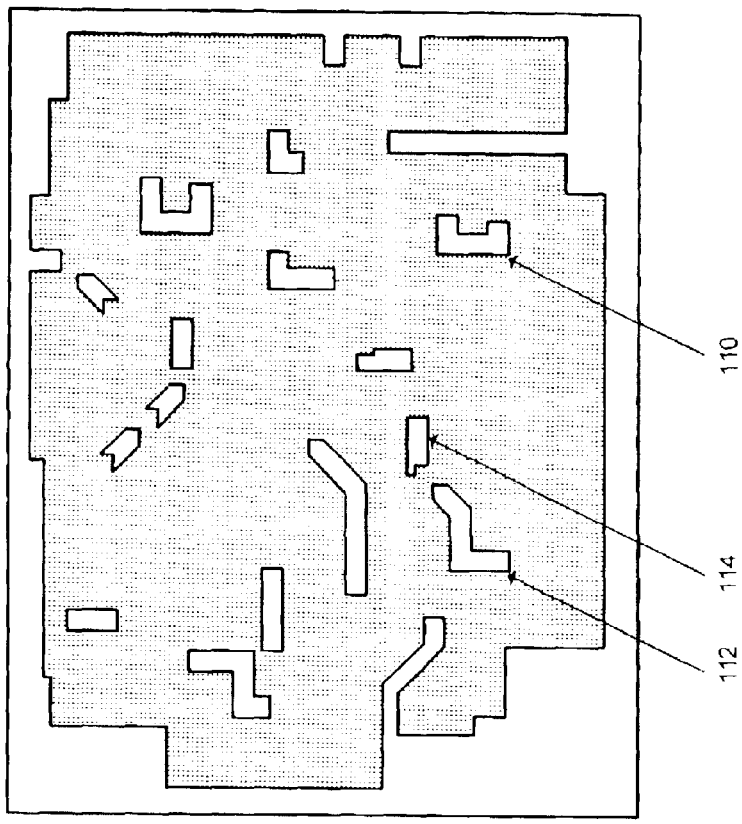
FIG. 1B illustrates a complementary mask 101 that includes cuts for clearing phase conflicts generated by phase shifting mask 100.
Figure 1A:
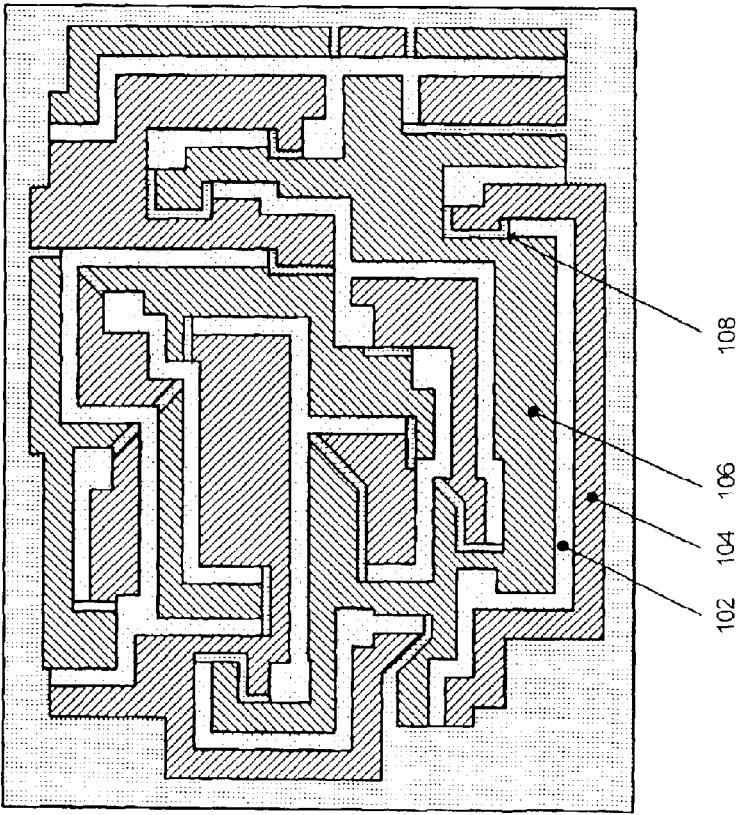
FIG. 1A illustrates a phase shifting mask 100 used in manufacturing an integrated circuit.
Figure 5B:
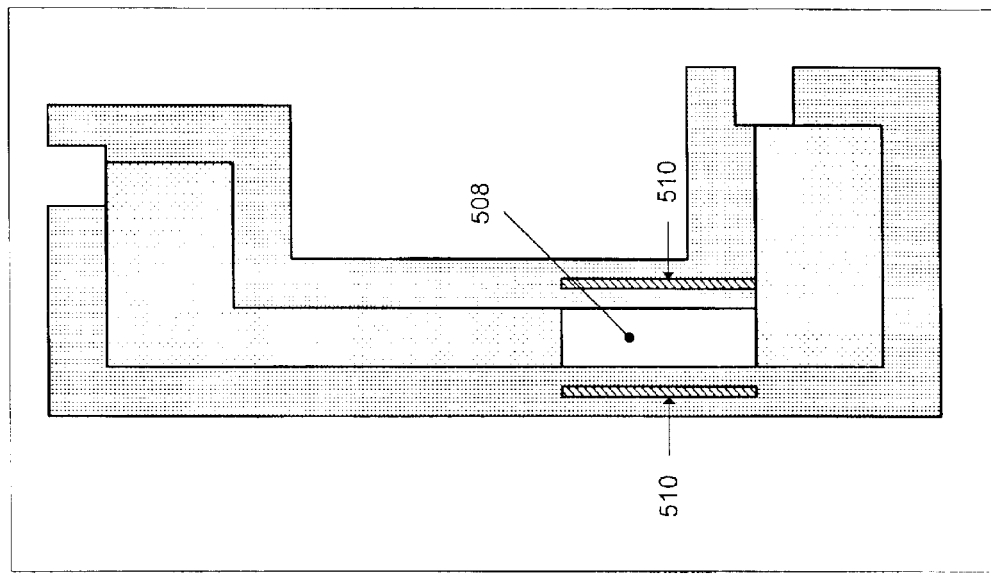
FIG. 5B illustrates the use of assist features for cuts on a complementary mask in accordance with an embodiment of the invention.
Figure 5A:
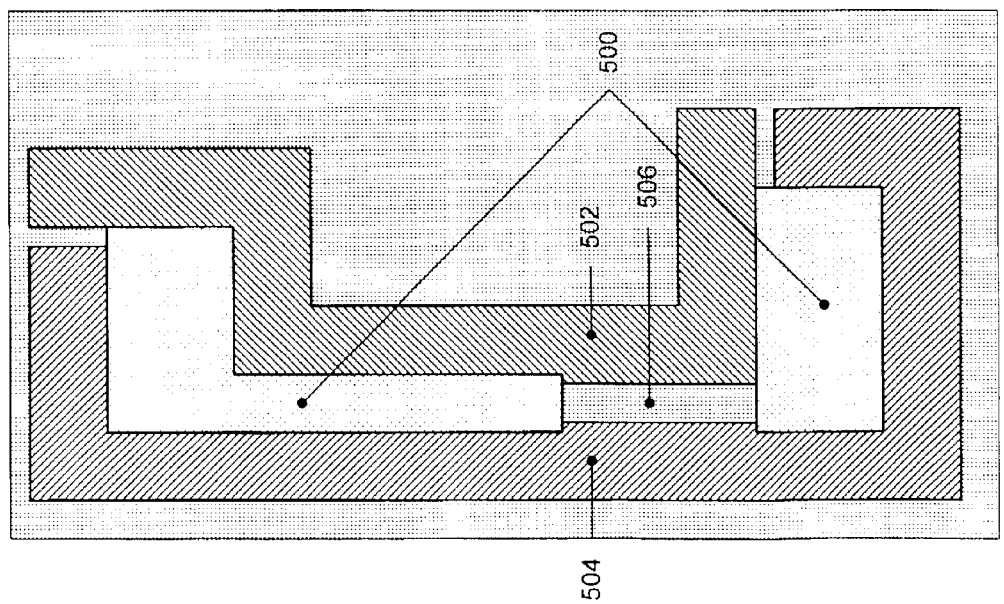
FIG. 5A illustrates a phase shift mask including a void area 506 in accordance with an embodiment of the invention.

FIG. 5A illustrates a phase shift mask including a chromium area 506 between phase shifters 504 and 502 in accordance with an embodiment of the invention (as in FIG. 1, a lighter stipple is used to distinguish the original intended layout from the remainder of the dark field upon which the phase shifters are set). This phase shift mask includes zero-degree region 502 and 180-degree region 504 that collectively define features 500. Note that chromium area 506 is not fully exposed when used with a trim mask of the sort found in FIG. 5B that lacks the out of phase assist bars 510, which will cause bridging between the upper and lower portions of feature 500.

FIG. 5B illustrates the use of a cut 508 along with out-of-phase assist bars 510 in a complementary mask in accordance with an embodiment of the invention. As shown in FIG. 5B, cut 508 is assigned a zero-degree phase (or reference phase) while assist cuts 510 are assigned a 180-degree phase. The resulting exposure through cuts 508 and 510 fully exposes the resist in the areas blocked by the chromium area 506, thereby eliminating the possibility of bridging between the upper and lower features. (For convenience the original intended layout is shown in a layout stipple for reference purposes rather than the darker stipple used for the rest of the protective trim.)

Process of Creating a Complementary Mask

Figure 6:
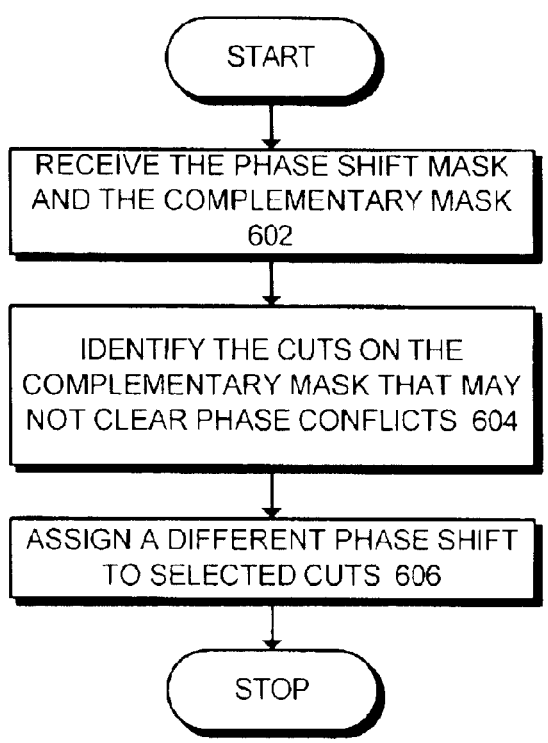
FIG. 6 is a flowchart illustrating the process of creating a complementary mask that assigns different phases to cuts in accordance with an embodiment of the invention.

FIG. 6 is a flowchart illustrating the process of creating a complementary mask with cuts that have different phases in accordance with an embodiment of the invention. The system starts by receiving a phase shift mask and a complementary mask (step 602). Next, the system identifies cuts on the complementary mask that may not clear phase conflicts on the phase shift mask (step 604). This can involve identifying cuts that are in close proximity to each other (e.g. predetermined halo, rules based matching, simulation of regions with dense cuts on the trim mask and automated and/or manual identification, etc.) and identifying isolated cuts that are too small to print correctly (e.g. using similar methods). Finally, the system assigns phases to selected cuts so that phase conflicts generated by the phase shift mask are cleared (step 606).

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In one embodiment, the carrier wave includes computer instruction signals for carrying out the process of FIG. 6.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

What is claimed is:

1. A method for using an exposure through a complementary mask to improve an exposure through a phase shifting mask used in fabricating an integrated circuit, comprising:

receiving the complementary mask for the integrated circuit, wherein the complementary mask uses cuts to clear phase conflicts generated by the phase shifting mask;

identifying the cuts on the complementary mask that may not clear the phase conflicts; and assigning a different phase to selected cuts on the complementary mask so that the selected cuts are out-of-phase with other cuts on the complementary mask;

wherein assigning the different phase ensures that the cuts on the complementary mask clear the phase conflicts generated by the phase shifting mask.

2. The method of claim 1, wherein identifying the cuts that may not clear the phase conflicts involves locating cuts that are close enough to each other to cause unwanted exposure in the region between the cuts during the exposure through the complementary mask.

3. The method of claim 2, further comprising varying the phase between cuts to eliminate the unwanted exposure in the region between the cuts during the exposure.

4. The method of claim 1, wherein identifying the cuts that may not clear the phase conflicts involves locating isolated cuts that are too small to clear the phase conflicts.

5. The method of claim 4, wherein assigning the different phase to selected cuts on the complementary mask involves adding out-of-phase assist features to the complementary mask in proximity to the isolated cuts.

6. The method of claim 1, wherein identifying the cuts on the complementary mask that may not clear the phase conflicts involves:

simulating exposures through the phase shifting mask and the trim mask to produce a simulation result; and examining the simulation result.

7. A computer-readable storage medium storing instructions that when executed by a computer cause the computer to perform a method for using an exposure through a complementary mask to improve an exposure through a phase shifting mask used in fabricating an integrated circuit, the method comprising:

receiving the complementary mask for the integrated circuit, wherein the complementary mask uses cuts to clear phase conflicts generated by the phase shifting mask;

identifying the cuts on the complementary mask that may not clear the phase conflicts; and assigning a different phase to selected cuts on the complementary mask so that the selected cuts are out-of-phase with other cuts on the complementary mask;

wherein assigning the different phase ensures that the cuts on the complementary mask clear the phase conflicts generated by the phase shifting mask.

8. The computer-readable storage medium of claim 7, wherein identifying the cuts that may not clear the phase conflicts involves locating cuts that are close enough to each other to cause unwanted exposure in the region between the cuts during the exposure through the complementary mask.

9. The computer-readable storage medium of claim 8, further comprising varying the phase between cuts to eliminate the unwanted exposure in the region between the cuts during the exposure.

10. The computer-readable storage medium of claim 7, wherein identifying the cuts that may not clear the phase conflicts involves locating isolated cuts that are too small to clear the phase conflicts.

11. The computer-readable storage medium of claim 10, wherein applying the phase shift to selected cuts on the complementary mask involves adding out-of-phase assist features to the complementary mask in proximity to the isolated cuts.

12. The computer-readable storage medium of claim 7, wherein identifying the cuts on the complementary mask that may not clear the phase conflicts involves:

simulating exposures through the phase shifting mask and the trim mask to produce a simulation result; and examining the simulation result.

13. A complementary mask to be used in fabricating an integrated circuit, wherein the complementary mask is formed by a method comprising:

receiving the complementary mask for the integrated circuit; and assigning a different phase to selected cuts on the complementary mask so that the selected cuts are out-of-phase with other cuts on the complementary mask.

14. The complementary mask of claim 13, wherein the complementary mask is used with a phase shifting mask and wherein the complementary mask uses cuts to clear phase conflicts generated by the phase shifting mask, the method further comprising identifying the cuts on the complementary mask that may not clear the phase conflicts, wherein assigning the different phase to selected cuts on the complementary mask ensures that the cuts on the complementary mask clear the phase conflicts generated by the phase shifting mask and wherein the complementary mask and the phase shifting mask are designed for exposure with substantially the same exposure parameters.

15. The complementary mask of claim 14, wherein identifying the cuts that may not clear the phase conflicts involves locating cuts that are close enough to each other to cause unwanted exposure in the region between the cuts during the exposure through the complementary mask.

16. The complementary mask of claim 15, the method further comprising varying the phase between cuts to eliminate the unwanted exposure in the region between the cuts during the exposure.

17. The complementary mask of claim 14, wherein identifying the cuts that may not clear the phase conflicts involves locating isolated cuts that are too small to clear the phase conflicts.

18. The complementary mask of claim 17, wherein assigning the different phase to selected cuts on the complementary mask involves adding out-of-phase assist features to the complementary mask in proximity to the isolated cuts.

19. The complementary mask of claim 14, wherein identifying the cuts on the complementary mask that may not clear the phase conflicts involves:
   simulating exposures through the phase shifting mask and the trim mask to produce a simulation result; and
   examining the simulation result.

20. An apparatus for using an exposure through a complementary mask to improve an exposure through a phase shifting mask used in fabricating an integrated circuit, comprising:
   a receiving mechanism configured to receiving the complementary mask for the integrated circuit, wherein the complementary mask uses cuts to clear phase conflicts generated by the phase shifting mask;
   an identifying mechanism configured to identify the cuts on the complementary mask that may not clear the phase conflicts; and
   an assigning mechanism configured to assign a different phase to selected cuts on the complementary mask so that the selected cuts are out-of-phase with other cuts on the complementary mask;
   wherein assigning the different phase ensures that the cuts on the complementary mask clear the phase conflicts generated by the phase shifting mask.

21. The apparatus of claim 20, further comprising a locating mechanism configured to locate cuts that are close enough to each other to cause unwanted exposure in the region between the cuts during the exposure through the complementary mask.

22. The apparatus of claim 21, further comprising a phase assignment mechanism configured to vary the phase between cuts to eliminate the unwanted exposure in the region between the cuts during the exposure.

23. The apparatus of claim 20, further comprising a locating mechanism configured to locate isolated cuts that are too small to clear the phase conflicts correctly.

24. The apparatus of claim 23, further comprising an adding mechanism configured to add out-of-phase assist features to the complementary mask in proximity to the isolated cuts.

25. The apparatus of claim 20, further comprising:
   a simulating mechanism configured to simulate exposures through the phase shifting mask and the trim mask to produce a simulation result; and
   an examining mechanism configured to examine the simulation result.

26. A means for using an exposure through a complementary mask to improve an exposure through a phase shifting mask used in fabricating an integrated circuit, comprising:
   a receiving means for receiving the complementary mask for the integrated circuit, wherein the complementary mask uses cuts to clear phase conflicts generated by the phase shifting mask;
   an identifying means for identifying the cuts on the complementary mask that may not clear the phase conflicts; and
   an assigning means for assigning a different phase to selected cuts on the complementary mask so that the selected cuts are out-of-phase with other cuts on the complementary mask;
   wherein assigning the different phase ensures that the cuts on the complementary mask clear the phase conflicts generated by the phase shifting mask.

* * * * *